United States Patent [19]
Wu

[11] Patent Number: 5,930,623
[45] Date of Patent: Jul. 27, 1999

[54] METHOD OF FORMING A DATA STORAGE CAPACITOR WITH A WIDE ELECTRODE AREA FOR DYNAMIC RANDOM ACCESS MEMORY USING DOUBLE SPACERS

[75] Inventor: Der-Yuan Wu, Hsinchu, Taiwan

[73] Assignee: United Microelectronics, Corporation, Hsin-Chu, Taiwan

[21] Appl. No.: 09/005,449

[22] Filed: Jan. 12, 1998

[30] Foreign Application Priority Data

Nov. 25, 1997 [TW] Taiwan ................................. 86117699

[51] Int. Cl.$^6$ ................................................. H01L 21/8242
[52] U.S. Cl. ......................... 438/253; 438/254; 438/256; 438/396; 438/397; 438/399
[58] Field of Search ..................................... 438/253, 254, 438/255, 256, 396, 397, 398, 399

[56] References Cited

U.S. PATENT DOCUMENTS

| 5,240,872 | 8/1993 | Motonami et al. ........................ 437/52 |
| 5,338,699 | 8/1994 | Ohi et al. ................................... 437/52 |
| 5,460,996 | 10/1995 | Ryou ......................................... 437/52 |
| 5,508,223 | 4/1996 | Tseng ......................................... 437/60 |
| 5,554,557 | 9/1996 | Koh ........................................... 437/52 |
| 5,795,805 | 8/1998 | Wu ........................................... 438/253 |
| 5,854,106 | 12/1998 | Wu ........................................... 438/253 |

*Primary Examiner*—Olik Chaudhuri
*Assistant Examiner*—Daniel H. Mao
*Attorney, Agent, or Firm*—Merchant, Gould, Smith, Edell, Welter & Schmidt, P.A.

[57] ABSTRACT

A method is provided for use on a DRAM (dynamic random access memory) device for forming a data storage capacitor with a wide electrode area, and thus a high capacitance, for the DRAM device. The high capacitance allows the data storage capacitor to preserve high data retaining capability when the DRAM device is downsized for high integration. The method is characterized in the forming of silicon-nitride based sidewall spacers and polysilicon-based sidewall spacers in openings formed in oxide layers that allows the subsequently formed contact window to be narrowed to a reduced width, thereby preventing the subsequent etching process to damage the nearby polysilicon-based bit lines and gate electrodes due to misalignment in the etching. Moreover, the method allows the resultant data storage capacitor to have a wide electrode area that helps increase the capacitance thereof, thereby allowing the DRAM device to preserve a high and reliable data retaining capability to the data stored therein.

16 Claims, 7 Drawing Sheets

1

METHOD OF FORMING A DATA STORAGE CAPACITOR WITH A WIDE ELECTRODE AREA FOR DYNAMIC RANDOM ACCESS MEMORY USING DOUBLE SPACERS

CROSS-REFERENCE TO RELATED APPLICATION

This application claims the priority benefit of Taiwan application serial no.86117699, filed Nov. 25, 1997, the full disclosure of which is incorporated herein by reference.

BACKGROUND OF THE INVENTION

1. Field of the Invention

This invention relates to semiconductor fabrication technologies, and more particularly, to a method of forming a data storage capacitor with a wide electrode area, and thus a high capacitance, for a DRAM (dynamic random access memory) device.

2. Description of Related Art

The DRAM is a volatile semiconductor read/write memory which is widely used in computers as the primary random access data storage means. FIG. 1 is a schematic diagram showing the equivalent circuit of each memory cell of a typical DRAM device, which includes a transfer transistor T and a data storage capacitor C. The transfer transistor T has a gate connected to a word line WL, a source connected to a bit line BL, and a drain connected to one electrode 6 of the data storage capacitor C. The opposed electrode 8 of the data storage capacitor C is connected to a fixed voltage source. Between the two electrodes 6, 8 is there formed with a dielectric layer 7. Whether this memory cell stores a binary data bit 0 or 1 is dependent on whether the data storage capacitor C is charged or not. In the fabrication of the DRAM device, it is desired that the capacitance of the data storage capacitor C be made as large as possible for high retaining capability and reliability of the data stored thereon.

In conventional DRAMs having a storage capacity less than 1 MB (megabit), it is a customary practice to form a two-dimensional capacitive structure, called a planar-type capacitor, as the data storage capacitor. FIG. 2 is a schematic sectional diagram showing the semiconductor structure of a conventional planar-type capacitor in a DRAM device. As shown, the DRAM device includes a semiconductor substrate 10 on which a field oxide layer 11 is formed to set apart each active region where one memory cell of the DRAM device is formed. A transfer transistor T, which includes a gate oxide layer 12, a gate 13, and a pair of source/drain regions 14, is formed on the substrate 10. Moreover, a dielectric layer 7 and a conductive layer 8 are formed beside the transfer transistor T; wherein the portions of the dielectric layer 7 and conductive layer 8 that are laid in the active region (as designated by the reference numeral 6) are used to serve as the data storage capacitor C of the transfer transistor T. It can be clearly seen from FIG. 2 that the planar-type capacitor should take up quite a large area on the substrate 10 in order to provide a large enough capacitance to allow reliable data retaining capability for the capacitor. The planar-type capacitor is therefore not suitable for use in high-integration DRAM devices where circuit layout space is limited.

In higher capacity DRAMs, such as 4 MB or higher DRAMs, a three-dimensional capacitive structure, such as a stacked-type or a trench-type capacitor, is used instead as the data storage capacitor.

FIG. 3 is a schematic sectional diagram showing the semiconductor structure of a conventional stack-type capacitor for use in a 4 MB DRAM device. As shown, the DRAM device includes a semiconductor substrate 10 on which a field oxide layer 11, a gate oxide layer 12, a gate 13, and a pair of source/drain regions 14 are formed, which in combination constitute a transfer transistor T. Further, an insulating layer 15 is formed over the wafer, which is selectively removed to form a contact opening to expose one of the source/drain regions 14. In the contact opening, a first conductive layer 6 (such as a polysilicon layer), a dielectric layer 7, and a second conductive layer 8 are successively formed, which in combination constitute a data storage capacitor for the DRAM device. The first conductive layer 6 serves as one electrode and the second conductive layer 8 serves as the opposing electrode. The stacked-type capacitor allows a high capacitance for reliable data retaining even when the DRAM device is further downsized. However, for still higher levels of integration, such as the 64 MB or higher DRAMs, the stacked-type capacitors can no longer meet the requirements.

FIG. 4 is a schematic sectional diagram showing the semiconductor structure of a conventional trench-type capacitor for use in a DRAM device. As shown, the DRAM device includes a semiconductor substrate 10 on which a field oxide layer 11, a gate oxide layer 12, a gate 13, and a pair of source/drain regions 14 are formed, which in combination constitute a transfer transistor T. Further, a trench is formed near one of the source/drain regions 14 that serves as drain; then, in the trench a capacitive structure is formed to serve as the data storage capacitor C, which includes a base electrode 6 (which is part of the substrate 10), a dielectric layer 7, and a polysilicon-based opposing electrode 8. This trench-type capacitor has a high capacitance due to its extended electrode surface in the trench. However, one drawback to this trench-type capacitor is that the forming of the trench by etching would easily cause crystalline defects to the substrate 10, which would then cause leakage current in the resultant DRAM device. Moreover, the etching rate decreases as the aspect ratio of the trench is increased, which would cause the fabrication process difficult to perform, thus affecting the throughput of the manufacture of the DRAM device.

Further, in the fabrication of a so-called capacitor-over-bitline (COB) structure with the submicron 0.25-$\mu$m design rule, the contact windows are formed in very close proximity to the nearby gates and polysilicon-based bit lines. In the subsequent etching process through these contact windows, the gates and the bit lines could therefore be damaged by the etching. Conventionally, there are two solutions to this problem: one solution is to use the self-aligned contact (SAC) technique to form silicon nitride based sidewall spacers both on the gate electrodes and the polysilicon-based bit lines so as to protect them from the etching; and the other solution is to use the phase-shift mask (PSM) technique. These two techniques, however, are still immature and thus can be difficult and troublesome to use.

SUMMARY OF THE INVENTION

It is therefore an objective of the present invention to provide a method for forming a data storage capacitor for a DRAM device, which has a wide electrode area to provide a high capacitance that allows reliable data retaining capability for the DRAM device even when the DRAM device is further downsized.

In accordance with the foregoing and other objectives of the present invention, an improved method for forming a data storage capacitor for a DRAM device is provided. The method of the invention includes the following steps:

providing a semiconductor substrate; then forming at least one transfer transistor on the substrate, the transfer transistor including a gate and a pair of source/drain regions; and then forming a first sidewall spacer on the sidewall of the gate;

forming a first oxide layer on the transfer transistor, and then forming a first contact window in the first oxide layer to expose the source of the transfer transistor;

forming a bit line in the first contact window, which is electrically connected to the source of the transfer transistor;

forming a second oxide layer which covers both the bit line and the first oxide layer;

forming a layer of silicon nitride over the second oxide layer;

forming a third oxide layer over the silicon nitride layer;

removing selected portions of the third oxide layer and the silicon nitride layer to thereby form an opening which exposes the second oxide layer;

forming a second sidewall spacer on the sidewall of the opening, which exposes the second oxide layer in the opening;

forming a polysilicon-based sidewall spacer on the sidewall of the second sidewall spacer in the opening, the polysilicon-based sidewall spacer allowing the opening which exposes selected portions of the second oxide layer to be narrowed;

forming a photoresist layer which exposes selected portions of the third oxide layer;

performing an etching process through the photoresist layer in such a manner that the polysilicon-based sidewall spacer is substantially left intact; the unmasked portions of the third oxide layer are substantially entirely etched away until the top surface of the silicon nitride layer is exposed; the second sidewall spacer is etched to a thickness substantially equal to the thickness of the silicon nitride layer; and the exposed portions of the second oxide layer along with the underlying portions of the first oxide layer are etched away until the top surface of the drain of the transfer transistor is exposed, thereby forming a second contact window which exposes the drain of the transfer transistor;

removing the photoresist layer;

forming a polysilicon layer which covers the polysilicon-based sidewall spacer, the silicon nitride layer, and the third oxide layer, and also fills up the second contact window and comes into contact with the drain of the transfer transistor;

removing those portions of the polysilicon layer that are laid directly over the third oxide layer, allowing the remaining portions of the polysilicon layer together with the polysilicon-based sidewall spacer to serve as a bottom electrode for the data storage capacitor of the DRAM device;

removing the third oxide layer until the silicon nitride layer is exposed;

forming a dielectric layer over the bottom electrode; and forming a conductive layer over the dielectric layer, which serves as an upper electrode opposing the bottom electrode for the data storage capacitor of the DRAM device.

The foregoing method of the invention has several characteristic features which are advantageous over the prior art. First, the forming of the silicon-nitride based sidewall spacers and the polysilicon-based sidewall spacers in the openings allows the subsequently formed contact window to be formed with a reduced width. The polysilicon-based sidewall spacers can combine with the subsequently formed third polysilicon layer to thereby allowing the resultant bottom electrode to have an increased surface area, and thus the capacitance of the resultant data storage capacitor. Second, a bottom electrode having increased surface area is provided for each memory cell of the DRAM device by forming the third polysilicon layer and then using the CMP technique to remove those portions of the third polysilicon layer that are laid above the oxide layer. Third, the particular shape of the bottom electrode and the use of the tantalum oxide as the dielectric layer allows the resultant data storage capacitor to be high in capacitance, so the data retaining capability is still high when the DRAM device is further downsized.

BRIEF DESCRIPTION OF DRAWINGS

The invention can be more fully understood by reading the following detailed description of the preferred embodiments, with reference made to the accompanying drawings, wherein.

DETAILED DESCRIPTION OF PREFERRED EMBODIMENTS

FIGS. 5A–5J are schematic sectional diagrams used to depict the steps involved in the method of the invention for forming a data storage capacitor for a DRAM device.

Figure 1:
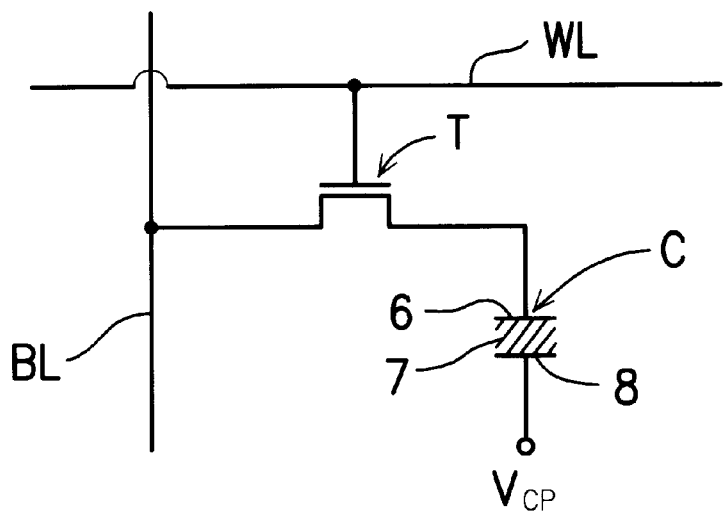
FIG. 1 (Prior Art) is a schematic diagram showing the equivalent circuit of a single memory cell of a DRAM device.
Figure 2:
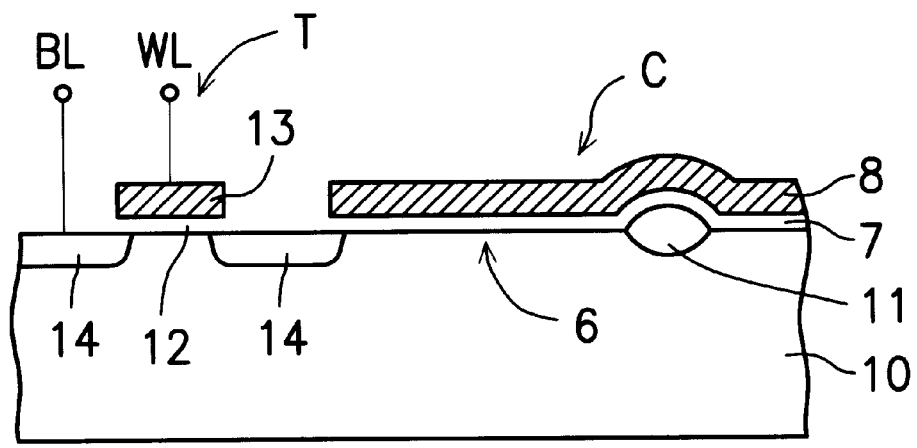
FIG. 2 (Prior Art) is a schematic sectional diagram showing the semiconductor structure of a conventional planar-type capacitor.
Figure 3:
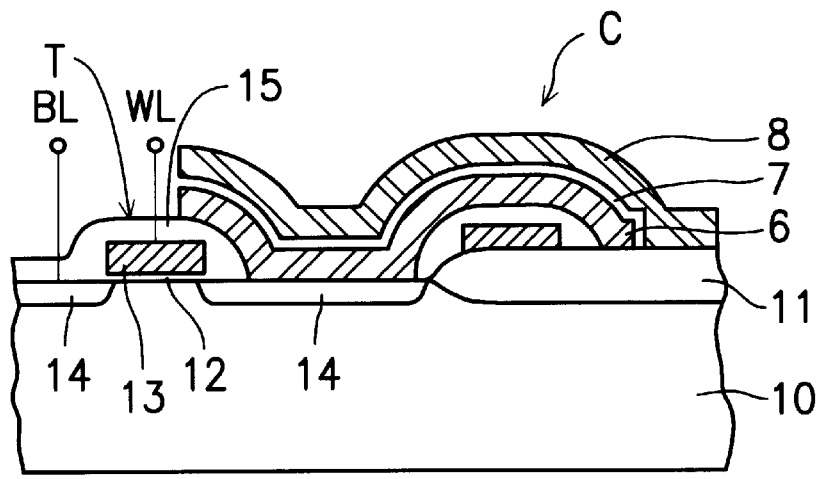
FIG. 3 (Prior Art) is a schematic sectional diagram showing the semiconductor structure of a conventional stack-type capacitor.
Figure 4:
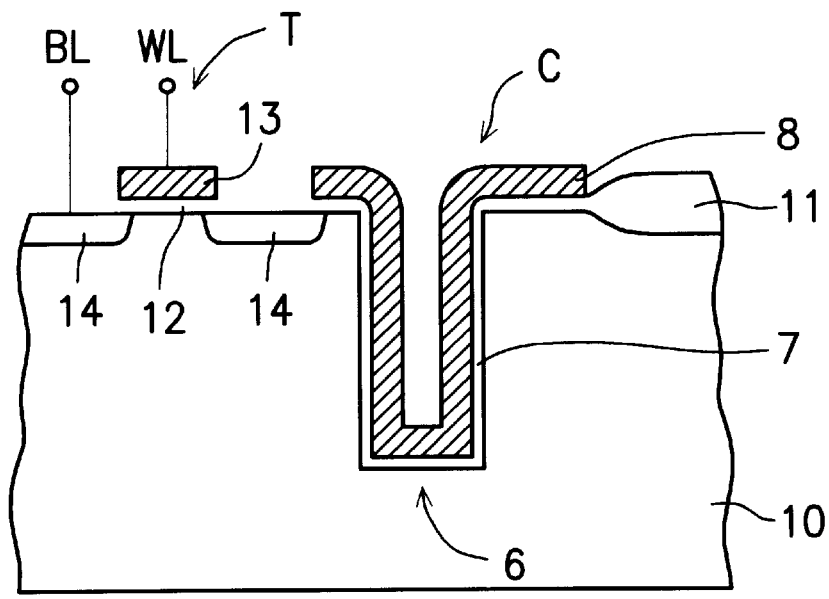
FIG. 4 (Prior Art) is a schematic sectional diagram showing the semiconductor structure of a conventional trench-type capacitor.
Figure 5A:
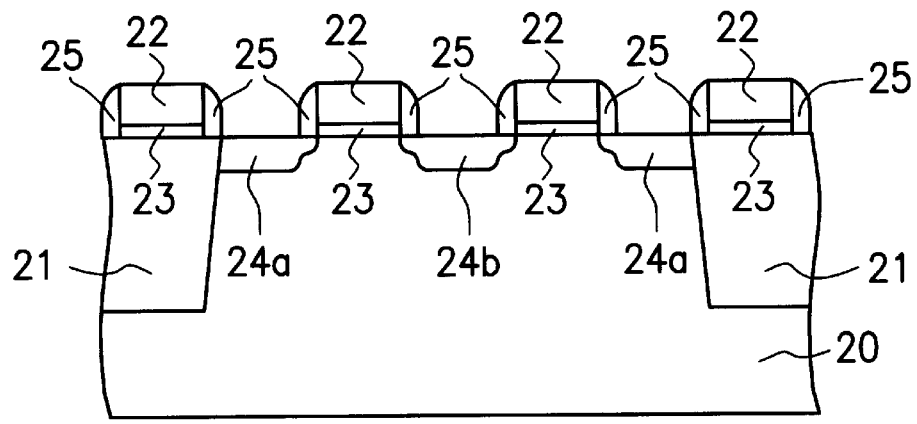
FIGS. 5A–5J are schematic sectional diagrams used to depict the steps involved in the method of the invention for forming a data storage capacitor for a DRAM device.

Referring first to FIG. 5A, in the first step, a semiconductor substrate 20 is prepared, and then a plurality of isolation regions 21 are formed on the substrate 20 so as to partition the substrate 20 into a plurality of active regions each being used to form one memory cell of the DRAM device therein. The isolation regions 21 can be, for example, shallow-trench structures or field oxide layers.

The subsequent step is to form a plurality of transfer transistors in the active regions on the substrate 20, each being used to form one memory cell of the DRAM device. Each transfer transistor comprises a gate electrode 22, a gate oxide layer 23 beneath the gate electrode 22, and a pair of source/drain regions 24a, 24b. The gate electrode 22 can be an impurity-doped polysilicon layer, which is formed through a low-pressure chemical-vapor deposition (LPCVD) process to a thickness of from 500 Å (angstrom) to 1,500 Å, and preferably 1,000 Å. Prior to the forming of sidewall spacers on the gate electrode 22, the source/drain regions 24a, 24b can be first lightly doped with an impurity material.

Subsequently, a plasma-enhanced chemical-vapor deposition (PECVD) process is performed on the wafer so as to form a layer of silicon nitride over the entire top surface of the wafer to a thickness of about 1,000 Å. Then, an anisotropic etching process is perform to etch back on the silicon nitride layer until the top surfaces of the source/drain regions 24a, 24b are exposed. The remaining portions of the silicon nitride layer are used to serve as sidewall spacers 25 on the sidewalls of the gate electrodes 22. After this, with the sidewall spacers 25 serving as a mask, an ion-implantation process is performed on the wafer so as to dope an impurity material of a high concentration into the source/drain regions 24a, 24b. This causes the source/drain regions 24a, 24b to be highly doped such that the conductivity thereof is increased. The sidewall spacers 25, which are formed from silicon nitride, can also serve as a protective layer in subsequent etching process.

Figure 5B:
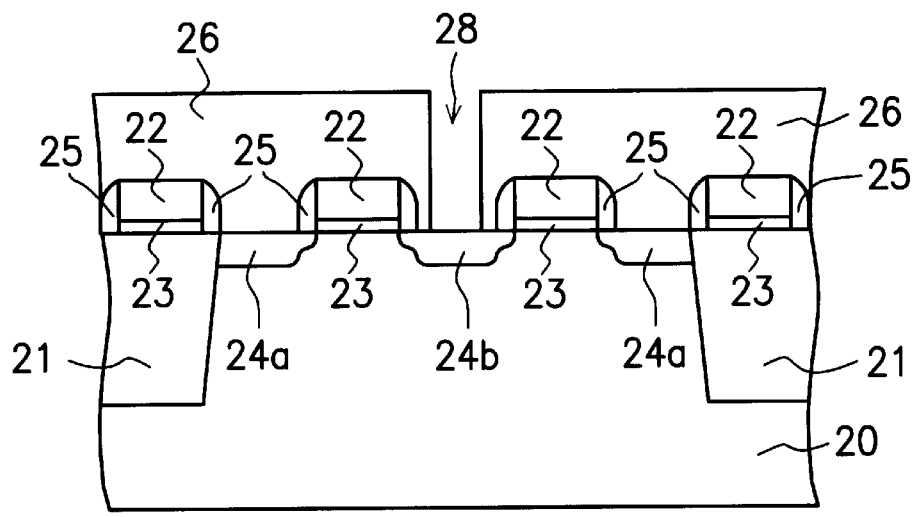

Referring next to FIG. 5B, in the subsequent step, an oxide layer 26, such as silicon oxide, is formed through a normal-pressure CVD process over the entire top surface of the wafer to a thickness of from 1,000 Å to 2,000 Å. Then, a photolithographic and etching process (such as dry etching) is performed on the oxide layer 26 so as to form a contact window 28 at a predefined location, which exposes the top surface of the second source/drain region 24b in each active region. During the dry etching process, the sidewall spacers 25, which are formed from silicon nitride, can serve as an etch protective layer, allowing the contact window 28 to be self aligned.

Figure 5C:
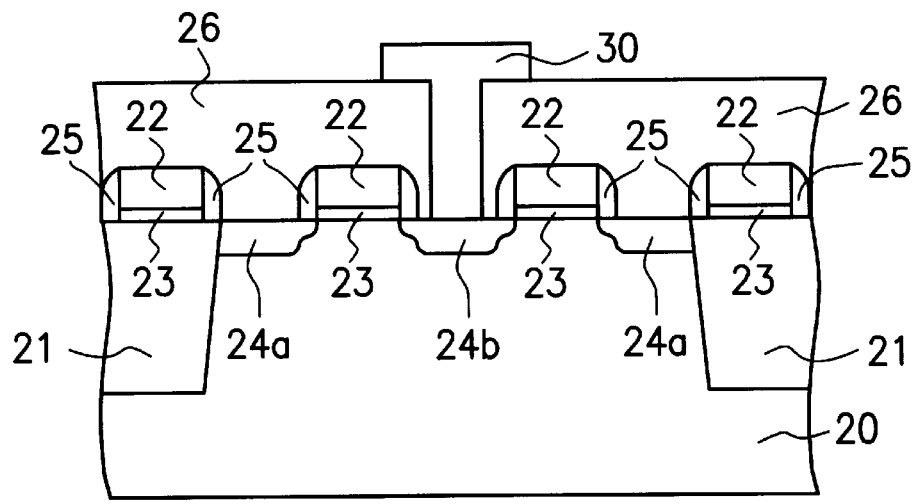

Referring further to FIG. 5C, in the subsequent step, an LPCVD process is performed on the wafer so as to form a layer of impurity-doped polysilicon layer to a thickness of about 1,000 Å over the oxide layer 26, which fills up each contact window 28 (FIG. 5B). The impurity-doped polysilicon layer is then selectively removed through a photolithographic and etching process. The remaining portion of the polysilicon layer, as designated by the reference numeral 30 in FIG. 5C, is used to serve as a bit line which is electrically connected to the second source/drain region 24b (here serving as a source).

Figure 5D:
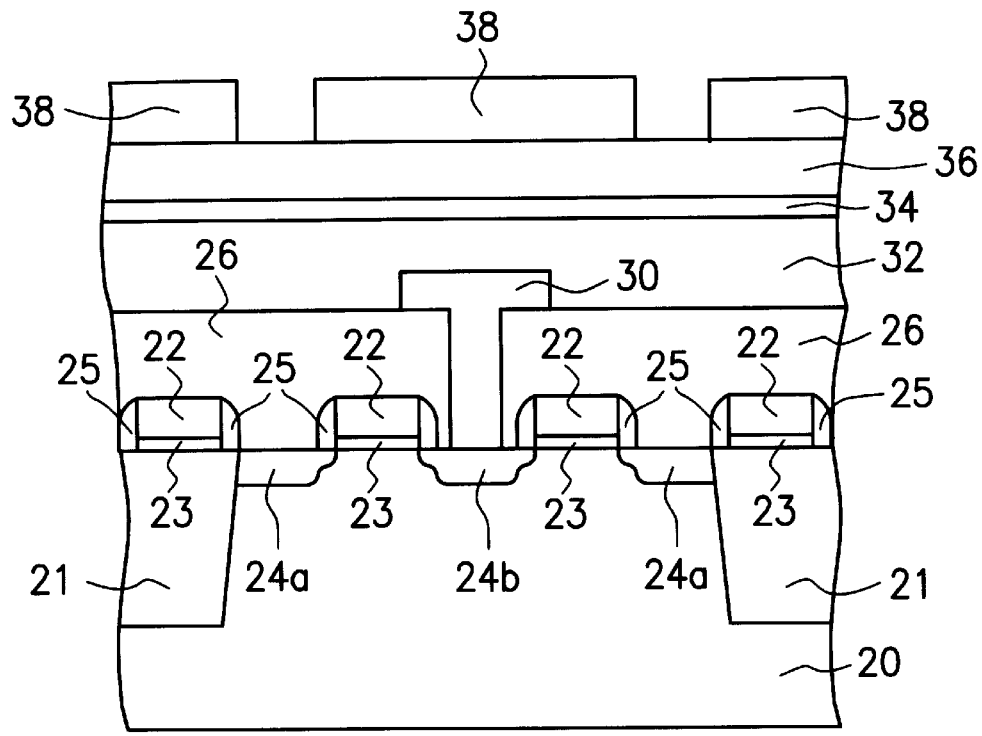

Referring next to FIG. 5D, in the subsequent step, a normal-pressure CVD process is performed on the wafer so as to form an oxide layer 32 to a thickness of about 1,500 Å over the oxide layer 26, which covers all the exposed surfaces of the polysilicon bit line 30 and the oxide layer 26. Next, a PECVD process is performed on the wafer so as to form a layer of silicon nitride 34 to a thickness of about 300 Å over the entire oxide layer 32. Subsequently, the PECVD process is performed again on the wafer so as to form an oxide layer 36, such as a layer of borophosphosilicate glass (BPSG), to a thickness of about 1,500 Å over the entire silicon nitride layer 34. After this, a photoresist layer 38 is formed over the oxide layer 36, which is then selectively removed to expose those areas on the oxide layer 36 that are directly located above the first source/drain regions 24a.

Figure 5E:
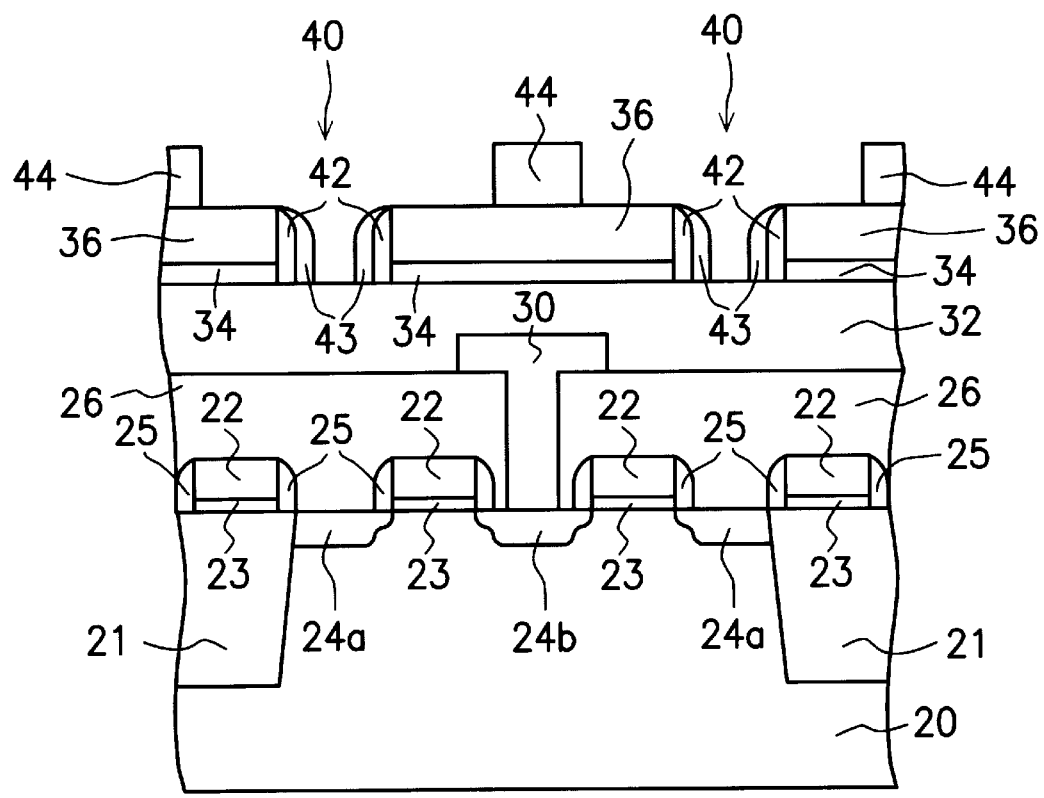

Referring further to FIG. 5E, in the subsequent step, an etching process is performed on the wafer so as to remove the exposed portions of the oxide layer 36 and the underlying silicon nitride layer 34 until the top surface of the oxide layer 32 is exposed, whereby a plurality of openings 40 are formed. After this, the entire photoresist layer 38 is removed. Subsequently, a PECVD process is performed on the wafer so as to form a layer of silicon nitride over the entire top surface of the wafer, which fills up all of the openings 40. A dry etching process is then performed to etch back on the silicon nitride layer. The remaining portions of the silicon nitride layer through this process serve as sidewall spacers 42 (hereinafter referred to as silicon-nitride based sidewall spacers) on the sidewalls of the oxide layer 36 and the underlying silicon nitride layer 34 in the openings 40.

Further, a PECVD process is performed on the wafer so as to deposit a polysilicon layer over the entire top surface of the wafer; and then a dry etching process is performed to etch back on the photoresist layer until the top surface of the oxide layer 32 is exposed. The remaining portions of the polysilicon layer, as designated by the reference numeral 43 in FIG. 5E, are used to serve as sidewall spacers (hereinafter referred to as polysilicon-based sidewall spacers) on the sidewalls of the silicon-nitride based sidewall spacers 42.

Subsequently, a photoresist layer 44 is formed over the oxide layer 36, which is then selectively removed to expose the openings 40 and those areas above the gate electrodes 22.

Figure 5F:
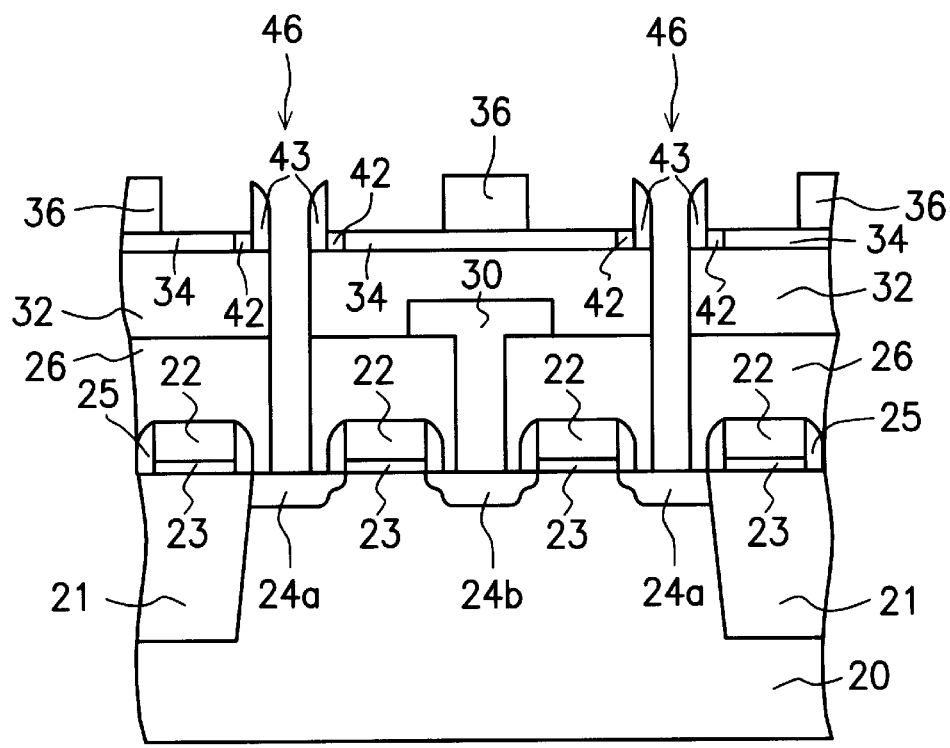

Referring to FIG. 5F, in the subsequent step, an etching process is performed on the wafer with various etching rates on silicon nitride, polysilicon, and oxide, such that the following results are achieved: (1) each polysilicon-based sidewall spacer 43 is substantially left intact; (2) the unmasked portions of the oxide layer 36 are entirely etched away until the top surface of the silicon nitride layer 34 is exposed; (3) each silicon-nitride based sidewall spacer 42 is etched until the thickness thereof is substantially equal to the thickness of the neighboring silicon nitride layer 34; and (4) through the openings 40, the exposed portions of the oxide layer 32, along with the underlying portions of the oxide layer 26, are etched away until the top surface of the first source/drain regions 24a is exposed, thereby forming a contact window 46 above each first source/drain region 24a (here serving a drain). The oxide layers 36 are used to set apart each data storage capacitor that is to be formed in the DRAM device.

The invention is characterized in the combined use of the silicon-nitride based sidewall spacers 42 together with the polysilicon-based sidewall spacers 43 to narrow each contact window 46 to a reduced width. This can help protect the underlying gate electrodes 22 from being damaged by the subsequent etching process, and also can help the self-aligning of the contact window 46 so that the contact window 46 can be precisely aligned to the first source/drain region 24a without causing damage to nearby components.

Figure 5G:
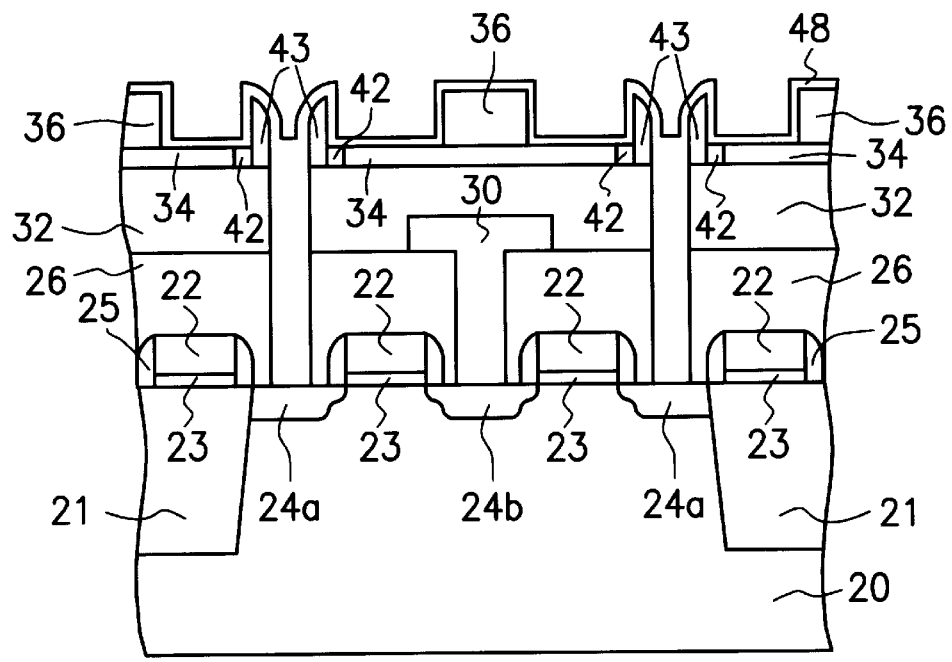

Referring further to FIG. 5G, after the contact window 46 above each first source/drain region 24a is formed, the subsequent step is to perform an LPCVD process on the wafer so as to form a third polysilicon layer 48 to a thickness of about 1,000 Å over the entire top surface of the wafer, which covers all of the exposed surfaces of the polysilicon-based sidewall spacers 43, the silicon-nitride based sidewall spacers 42, the silicon nitride layer 34, and the oxide layer 36, and also fills up all of the contact windows 46, allowing each first source/drain region 24a to come into electrical contact with the third polysilicon layer 48. The third polysilicon layer 48 can be impurity-doped so as to increase the conductivity thereof.

Figure 5H:
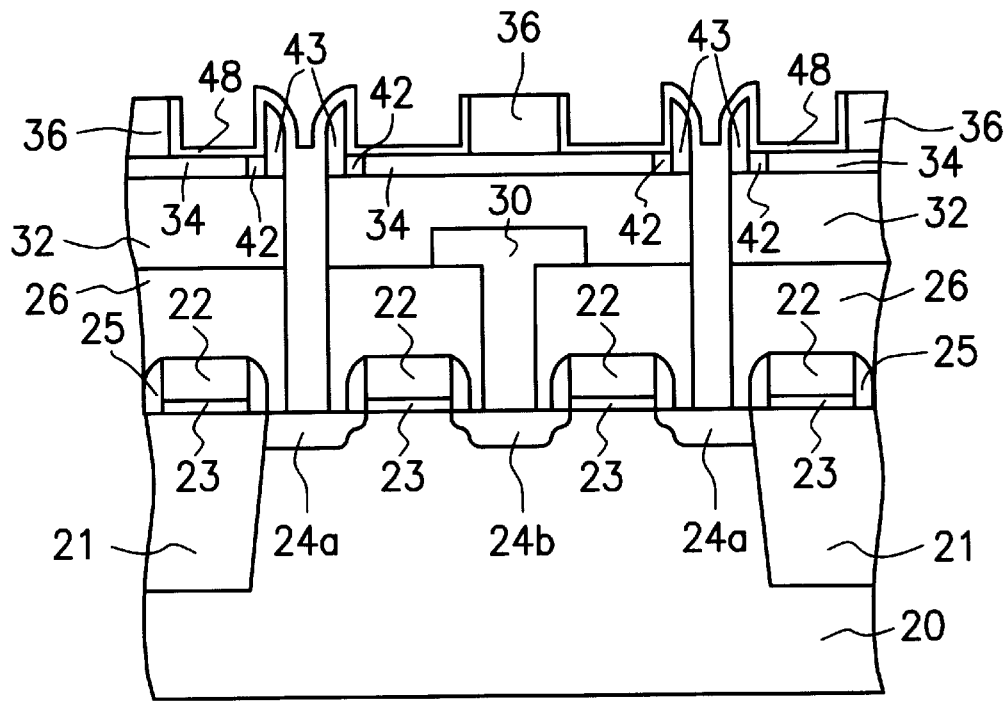

Referring next to FIG. 5H, in the subsequent step, a chemical-mechanical polish (CMP) process is performed on the wafer so as to remove those portions of the third polysilicon layer 48 that are laid directly over the oxide layers 36. Through this process, the top surface of each oxide layer 36 is exposed.

Figure 5I:
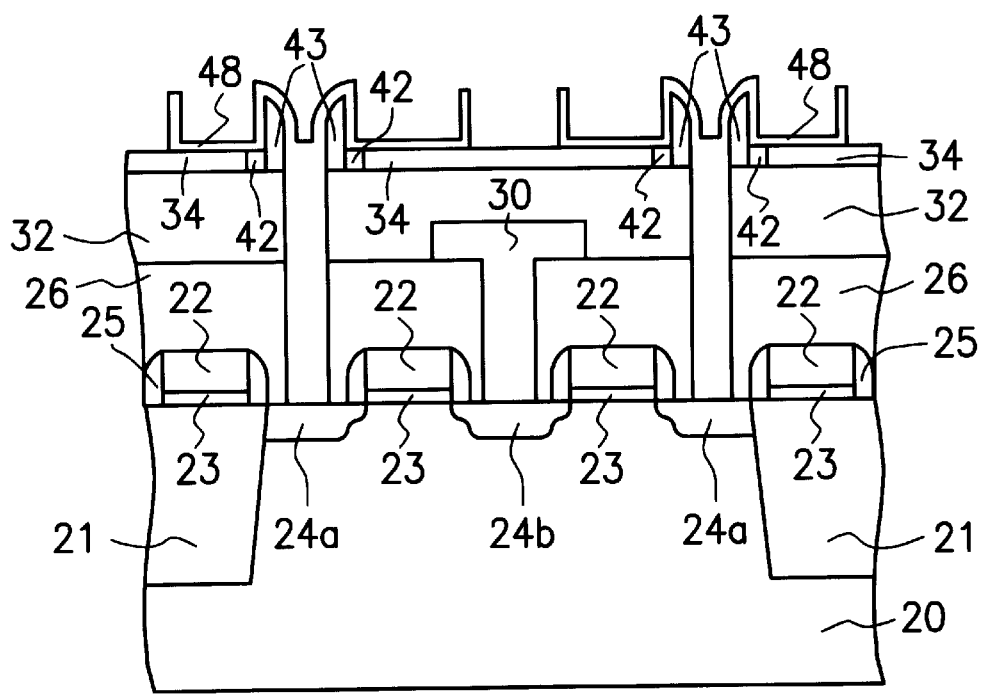

Referring further to FIG. 5I, in the subsequent step, a wet etching process with a high selective ratio on oxide and polysilicon (i.e., the etching on oxide is significantly much larger in rate than the etching on polysilicon) is performed on the wafer, whereby the oxide layer 36 is substantially entirely removed while leaving the third polysilicon layer 48 substantially intact. The third polysilicon layer 48 is to be used to serve as the bottom electrode of the data storage capacitor of each memory cell in the DRAM device.

Figure 5J:
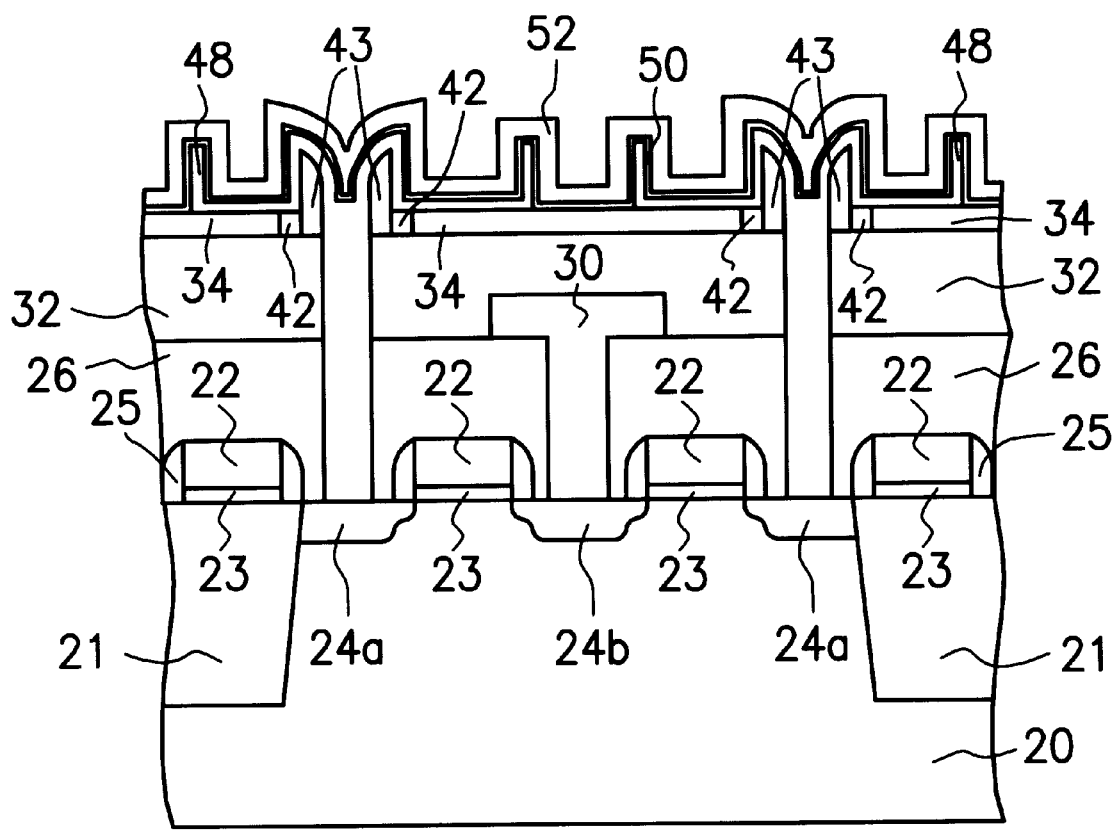

Referring further to FIG. 5J, in the subsequent step, a dielectric layer 50, such as a layer of the oxide/nitride/oxide (ONO) structure or a layer of tantalum oxide, is formed over the entire top surface of the wafer. After this, a fourth polysilicon layer 52 is deposited over the dielectric layer 50 to a thickness of from 500 to 1,000 Å. The fourth polysilicon layer 52 is used to serve as the upper electrode of the data storage capacitor. In the case of the dielectric layer 50 being formed from tantalum oxide, the fourth polysilicon layer 52 can be impurity-doped or a stacked structure of titanium and titanium nitride.

Up to this point, the process for forming the data storage capacitor for each memory cell in the DRAM device is completed. The subsequent steps to complete the fabrication of the DRAM device are all conventional techniques that are not within the spirit of the invention, so detailed description thereof will not be given in this specification.

In conclusion, the invention has several characteristic features which are advantageous over the prior art. First, the forming of the silicon-nitride based sidewall spacers 42 and the polysilicon-based sidewall spacers 43 in the openings 40 allows the subsequently formed contact window 46 to be formed with a reduced width that can help protect the nearby components from being damaged in the subsequent etching process. Moreover, the polysilicon-based sidewall spacers 43, when combined with the subsequently formed third polysilicon layer 48, can allow the resultant bottom electrode to have an increased surface area, and thus the capacitance of the resultant data storage capacitor. Second, a bottom electrode having increased surface area is provided for each memory cell of the DRAM device by forming the third polysilicon layer 48 and then using the CMP technique to remove those portions of the third polysilicon layer 48 that are laid above the oxide layer 36. Third, the particular shape of the bottom electrode and the use of the tantalum oxide as the dielectric layer allows the resultant data storage capacitor to be high in capacitance, so the data retaining capability is still high when the DRAM device is further downsized.

The invention has been described using exemplary preferred embodiments. However, it is to be understood that the scope of the invention is not limited to the disclosed embodiments. On the contrary, it is intended to cover various modifications and similar arrangements. The scope of the claims, therefore, should be accorded the broadest interpretation so as to encompass all such modifications and similar arrangements.

What is claimed is:

1. A method of forming a data storage capacitor in a DRAM device, comprising:

providing a semiconductor substrate; then forming at least one transfer transistor on the substrate, the transfer transistor including a gate and a pair of source/drain regions; and then forming a first sidewall spacer on the sidewall of the gate;

forming a first oxide layer on the transfer transistor, and then forming a first contact window in the first oxide layer to expose the source of the transfer transistor;

forming a bit line in the first contact window, which is electrically connected to the source of the transfer transistor;

forming a second oxide layer which covers both the bit line and the first oxide layer;

forming a layer of silicon nitride over the second oxide layer;

forming a third oxide layer over the silicon nitride layer;

removing selected portions of the third oxide layer and the silicon nitride layer to thereby form an opening which exposes the second oxide layer;

forming a second sidewall spacer on the sidewall of the opening, which exposes the second oxide layer in the opening;

forming a polysilicon-based sidewall spacer on the sidewall of the second sidewall spacer in the opening, the polysilicon-based sidewall spacer allowing the opening which exposes selected portions of the second oxide layer to be narrowed;

forming a photoresist layer which exposes selected portions of the third oxide layer;

performing an etching process through the photoresist layer in such a manner that the polysilicon-based sidewall spacer is substantially left intact; the unmasked portions of the third oxide layer are substantially entirely etched away until the top surface of the silicon nitride layer is exposed; the second sidewall spacer is etched to a thickness substantially equal to the thickness of the silicon nitride layer; and the exposed portions of the second oxide layer along with the underlying portions of the first oxide layer are etched away until the top surface of the drain of the transfer transistor is exposed, thereby forming a second contact window which exposes the drain of the transfer transistor;

removing the photoresist layer;

forming a polysilicon layer which covers the polysilicon-based sidewall spacer, the silicon nitride layer, and the third oxide layer, and also fills up the second contact window and comes into contact with the drain of the transfer transistor;

removing those portions of the polysilicon layer that are laid directly over the third oxide layer, allowing the remaining portions of the polysilicon layer together with the polysilicon-based sidewall spacer to serve as a bottom electrode for the data storage capacitor of the DRAM device;

removing the third oxide layer until the silicon nitride layer is exposed;

forming a dielectric layer over the bottom electrode; and forming a conductive layer over the dielectric layer, which serves as an upper electrode opposing the bottom electrode for the data storage capacitor of the DRAM device.

2. The method of claim 1, wherein the step of forming the bit line includes a low-pressure CVD process.

3. The method of claim 1, wherein the step of forming the first oxide layer includes a normal-pressure CVD process.

4. The method of claim 1, wherein the step of forming the second oxide layer includes a normal-pressure CVD process.

5. The method of claim 1, wherein the step of forming the third oxide layer includes a plasma-enhanced CVD process.

6. The method of claim 1, wherein the step of forming the silicon nitride layer includes a plasma-enhanced CVD process.

7. The method of claim 1, wherein the etching process is performed on the wafer with selected various etching rates on oxide, silicon nitride, and polysilicon.

8. The method of claim 1, wherein the step of forming the polysilicon layer includes a low-pressure CVD process.

9. The method of claim 1, wherein the step of removing those portions of the polysilicon layer includes a CMP process.

10. The method of claim 1, wherein the first sidewall spacer includes silicon nitride.

11. The method of claim 1, wherein the bit line includes impurity-doped polysilicon.

12. The method of claim 1, wherein the second sidewall spacer includes silicon nitride.

13. The method of claim 1, wherein the third oxide layer includes borophosphosilicate glass.

14. The method of claim 1, wherein the dielectric layer includes a layer of the oxide/nitride/oxide structure.

15. The method of claim 1, wherein the dielectric layer includes tantalum oxide.

16. The method of claim 15, wherein the upper electrode includes a layer of titanium and titanium nitride.

* * * * *